(12) United States Patent
Hwang

(10) Patent No.: US 9,286,954 B2
(45) Date of Patent: Mar. 15, 2016

(54) BUFFER CIRCUIT OF SEMICONDUCTOR APPARATUS

(71) Applicant: SK hynix Inc., Icheon-si Gyeonggi-do (KR)

(72) Inventor: Jin Ha Hwang, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 1 day.

(21) Appl. No.: 14/194,006

(22) Filed: Feb. 28, 2014

(65) Prior Publication Data

US 2015/0155012 A1 Jun. 4, 2015

(30) Foreign Application Priority Data

Nov. 29, 2013 (KR) ........................ 10-2013-0147155

(51) Int. Cl.
G11C 7/10 (2006.01)
G11C 7/02 (2006.01)
G11C 7/22 (2006.01)
G11C 16/28 (2006.01)

(52) U.S. Cl.
CPC *G11C 7/02* (2013.01); *G11C 7/106* (2013.01); *G11C 7/1057* (2013.01); *G11C 7/22* (2013.01); *G11C 16/28* (2013.01)

(58) Field of Classification Search
USPC .................................................. 365/189.05
See application file for complete search history.

(56) References Cited

U.S. PATENT DOCUMENTS

| 6,140,834 A * | 10/2000 | Takahashi ...... H03K 19/018528 326/21 |
| 6,157,203 A * | 12/2000 | Takahashi ...... H03K 19/018528 326/21 |
| 2011/0062984 A1* | 3/2011 | Kuwahara ............ G11C 7/1051 326/30 |

FOREIGN PATENT DOCUMENTS

KR 100203139 B1 3/1999
KR 1020100100132 A 9/2010

OTHER PUBLICATIONS

Bernhard Goll et al., "A Comparator With Reduced Delay Time in 65-nm CMOS for Supply Voltages Down to 0.65 V," IEEE Transactions on Circuits and Systems II: Express Briefs, Nov. 2009, pp. 810-814, vol. 56, No. 11, IEEE.

* cited by examiner

*Primary Examiner* — Hoai V Ho
*Assistant Examiner* — Pablo Huerta
(74) *Attorney, Agent, or Firm* — William Park & Associates Ltd.

(57) ABSTRACT

A buffer circuit of a semiconductor apparatus includes a sensing circuit configured to sense input signals according to a data strobe signal, generate latch control signals, provide the latch control signals at nodes, and remove parasitic components of the nodes in response to a clock signal; and a latch circuit configured to generate and latch output data in response to the latch control signals.

7 Claims, 5 Drawing Sheets

$I_x = (g_{m2} + sC_1) V_2$
$I_x = (g_{m1} + sC_1) V_1$
$V_x = V_1 - V_2$
$V_x / I_x = -2/(g_m + C_1 s)$

BUFFER CIRCUIT OF SEMICONDUCTOR APPARATUS

CROSS-REFERENCES TO RELATED APPLICATION

The present application claims priority under 35 U.S.C. §119(a) to Korean application number 10-2013-0147155, filed on Nov. 29, 2013, in the Korean Intellectual Property Office, which is incorporated herein by reference in its entirety.

BACKGROUND

1. Technical Field

Various embodiments generally relate to a semiconductor apparatus, and more particularly, to a buffer circuit of a semiconductor apparatus.

2. Related Art

A semiconductor apparatus may use a latch type buffer for stable data strobing.

Recently, as a semiconductor apparatus trends toward a low operation voltage, a buffer circuit appropriate for a low power consumption and high speed operation is demanded.

SUMMARY

In an embodiment, a buffer circuit of a semiconductor apparatus may include: a sensing circuit configured to sense input signals according to a data strobe signal, generate latch control signals, provide the latch control signals at nodes, and remove parasitic components of the nodes in response to a clock signal; and a latch circuit configured to generate and latch output data in response to the latch control signals.

In an embodiment, a buffer circuit of a semiconductor apparatus may include: a sensing unit configured to electrically couple with a power supply terminal, sense a voltage level difference of differential input signals during an activation period of a data strobe signal, generate latch control signals, and provide the latch control signals at nodes; an activation unit configured to electrically couple with a ground terminal, and activate a current path of the sensing unit in response to the data strobe signal; an input unit configured to electrically couple with the activation unit, and receive the differential input signals; and a compensation unit electrically coupled with the sensing unit and the input unit, and configured to remove parasitic components of the nodes in response to a clock signal.

In an embodiment, the compensation unit may be configured to operate as a capacitor for a predetermined time in response to the clock signal as a body bias.

In an embodiment, a circuit of a semiconductor apparatus may include: a sensing unit configured to sense a voltage level difference of differential input signals during an activation period of a data strobe signal, generate and provide a first differential latch control signal at a first node, and generate and provide a second differential latch control signal at a second node; an activation unit configured to activate a current path of the sensing unit in response to the data strobe signal; and a capacitor electrically coupled with the first node and the second node, and configured to remove parasitic components of the first and second nodes in response to a clock signal.

In an embodiment, a computing system includes: a memory system including a memory controller including a processor; and a memory device configured to receive data from the controller, the memory device including a buffer circuit including: a sensing circuit configured to sense input signals, generate output signals, provide the output signals at nodes, and remove parasitic components of the nodes; and a latch circuit configured to generate and latch output data in response to the output signals of the sensing circuit.

BRIEF DESCRIPTION OF THE DRAWINGS

Features, aspects, and embodiments are described in conjunction with the attached drawings, in which.

DETAILED DESCRIPTION

Hereinafter, a buffer circuit of a semiconductor apparatus according to the present disclosure will be described below with reference to the accompanying drawings through various example of embodiments.

Figure 1:
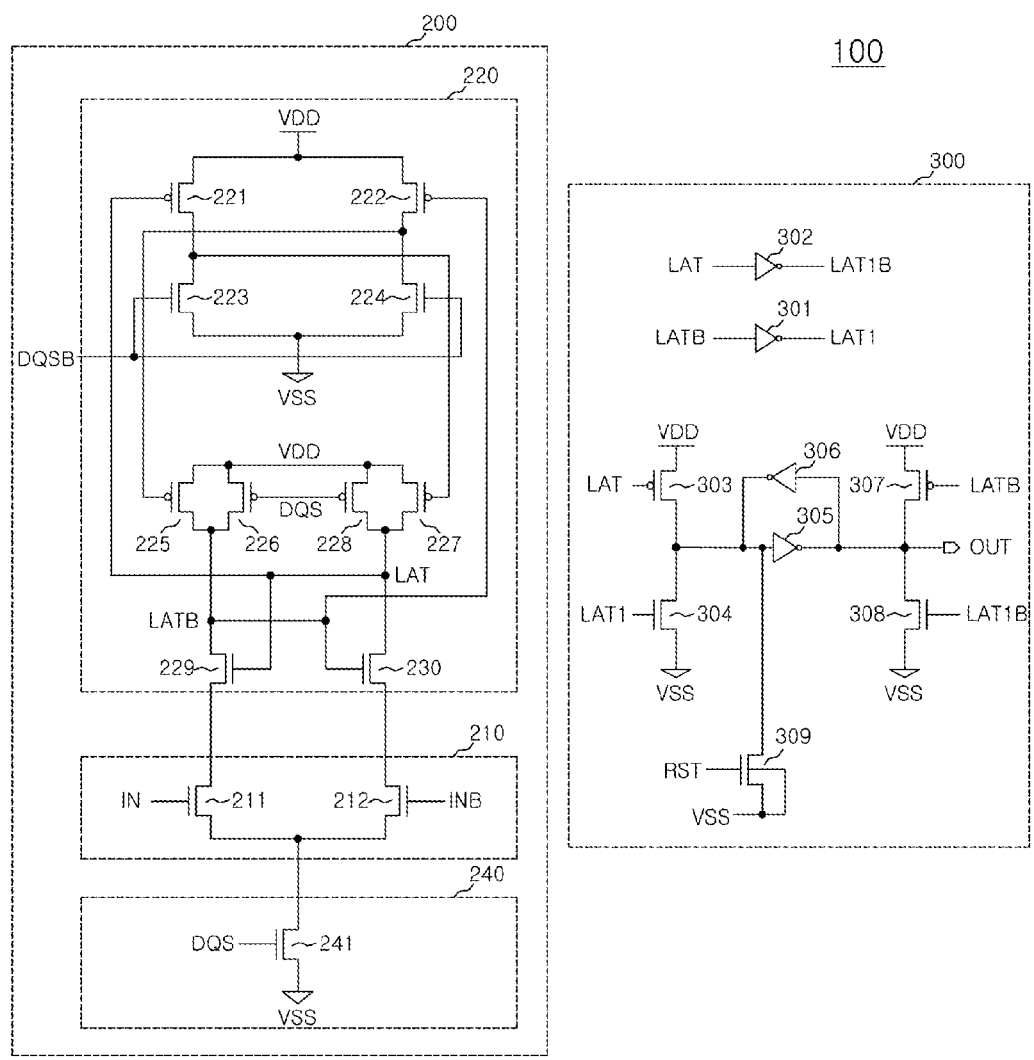
FIG. 1 is a circuit diagram showing a buffer circuit of a semiconductor apparatus in accordance with an embodiment.

As shown in FIG. 1, a buffer circuit 100 of a semiconductor apparatus in accordance with an embodiment may include a sensing circuit 200 and a latch circuit 300.

The sensing circuit 200 may be configured to sense input signals IN and INB in response to data strobe signals DQS and DQSB, and generate output signals, that is, latch control signals LAT and LATB.

The data strobe signals DQS and DQSB may be differential signals, the input signals IN and INB may be differential signals, and the latch control signals LAT and LATB may be differential signals.

The sensing circuit 200 may include an input unit 210, a sensing unit 220, and an activation unit 240.

The input unit 210 may be configured to receive the input signals IN and INB.

The input unit 210 may include first and second transistors 211 and 212.

The first transistor 211 has the gate which receives the input signal IN.

The second transistor 212 has the gate which receives the input signal INB and a source which is electrically coupled with the source of the first transistor 211.

The sensing unit 220 may be configured to sense the voltage level difference of the input signals IN and INB during the activation period of the data strobe signals DQS and DQSB, and generate the output signals, that is, the latch control signals LAT and LATB.

The sensing unit 220 may include third to twelfth transistors 221 to 230.

The third transistor 221 has a gate to which the latch control signal LAT is inputted and a source to which a power supply voltage VDD is applied.

The fourth transistor 222 has the gate to which the latch control signal LATB is inputted and the source to which the power supply voltage VDD is applied.

The fifth transistor 223 has the gate to which the data strobe signal DQSB is inputted, the source to which a ground voltage VSS is applied and the drain which is electrically coupled with the drain of the third transistor 221.

The sixth transistor 224 has the gate to which the data strobe signal DQSB is inputted, the source to which the ground voltage VSS is applied and the drain which is electrically coupled with the drain of the fourth transistor 222.

The seventh transistor 225 has the gate which is commonly electrically coupled with the drains of the fourth and sixth transistors 222 and 224 and the source to which the power supply voltage VDD is applied.

The eighth transistor 226 has the gate to which the data strobe signal DQS is inputted, the source to which the power supply voltage VDD is applied and the drain which is electrically coupled with the drain of the seventh transistor 225, and outputs the latch control signal LATB through the drain.

The ninth transistor 227 has the gate which is commonly electrically coupled with the drains of the third and fifth transistors 221 and 223 and the source to which the power supply voltage VDD is applied.

The tenth transistor 228 has the gate to which the data strobe signal DQS is inputted, the source to which the power supply voltage VDD is applied and the drain which is electrically coupled with the drain of the ninth transistor 227, and outputs the latch control signal LAT through the drain.

The eleventh transistor 229 has the gate which receives the latch control signal LAT and the drain which is electrically coupled with the drain of the first transistor 211 of the input unit 210.

The twelfth transistor 230 has the gate which receives the latch control signal LATB and the drain which is electrically coupled with the drain of the second transistor 212 of the input unit 210.

The activation unit 240 may be configured to activate the current path of the sensing circuit 200 in response to the data strobe signal DQS.

The activation unit 240 may include a thirteenth transistor 241.

The thirteenth transistor 241 has the gate which receives the data strobe signal DQS, the source which is applied with the ground voltage VSS and the drain which is commonly electrically coupled with the sources of the first and second transistors 211 and 212 of the input unit 210.

The latch circuit 300 may be configured to generate and latch output data OUT in response to the output signals of the sensing circuit 200, that is, the latch control signals LAT and LATB.

The latch circuit 300 may include first to fifth transistors 303, 304 and 307 to 309 and first to fourth inverters 301, 302, 305 and 306.

The first inverter 301 inverts and delays the latch control signal LATB and outputs a delayed latch control signal LAT1.

The second inverter 302 inverts and delays the latch control signal LAT and outputs a delayed latch control signal LAT1B.

The first transistor 303 has the gate which receives the latch control signal LAT and the source which is applied with the power supply voltage VDD.

The second transistor 304 has the gate which receives the delayed latch control signal LAT1, the source which is applied with the ground voltage VSS and the drain which is electrically coupled with the drain of the first transistor 303.

The third transistor 307 has the gate which receives the latch control signal LATB and the source which is applied with the power supply voltage VDD.

The fourth transistor 308 has the gate which receives the delayed latch control signal LAT1B, the source which is applied with the ground voltage VSS and the drain which is electrically coupled with the drain of the third transistor 307.

The output data OUT is generated from a node to which the drain of the third transistor 307 and the drain of the fourth transistor 308 are electrically coupled.

The third inverter 305 has the input terminal which is commonly electrically coupled with the drains of the first and second transistors 303 and 304 and the output terminal which is commonly electrically coupled with the drains of the third and fourth transistors 307 and 308.

The fourth inverter 306 feeds back the output of the third inverter 305 to the input terminal of the third inverter 305.

The fifth transistor 309 has the gate which receives a reset signal RST, the source and the bulk terminal to which the ground voltage VSS is commonly applied and the drain which is electrically coupled with the input terminal of the third inverter 305.

Operations of the buffer circuit 100 in accordance with an embodiment, configured as mentioned above, will be described below.

The activation unit 240 activates the current path of the sensing circuit 200 during the activation period of the data strobe signal DQS, that is, during a period in which the data strobe signal DQS is logic high and the data strobe signal DQSB is logic low.

The sensing unit 220 senses the voltage level difference of the input signals IN and INB inputted through the input unit 210, that is, differential signals, by interoperations of the third, fourth, seventh, ninth, tenth and eleventh transistors 221, 222, 225, 227, 229 an 230, and generates the latch control signals LAT and LATB.

Meanwhile, if the data strobe signal DQS is deactivated, that is, the data strobe signal DQS becomes logic low and the data strobe signal DQSB becomes logic high, the fifth to tenth transistors 223 to 228 perform an operation of initializing the sensing circuit 200, that is, an operation of precharging the latch control signals LAT and LATB to logic high.

The latch circuit 300 generates and latches the output data OUT of a level corresponding to the input signals IN and INB in response to the latch control signals LAT and LATB and the delayed latch control signals LAT1 and LAT1B.

The output terminal of the latch circuit 300 may be initialized to logic high by the reset signal RST.

Figure 2:
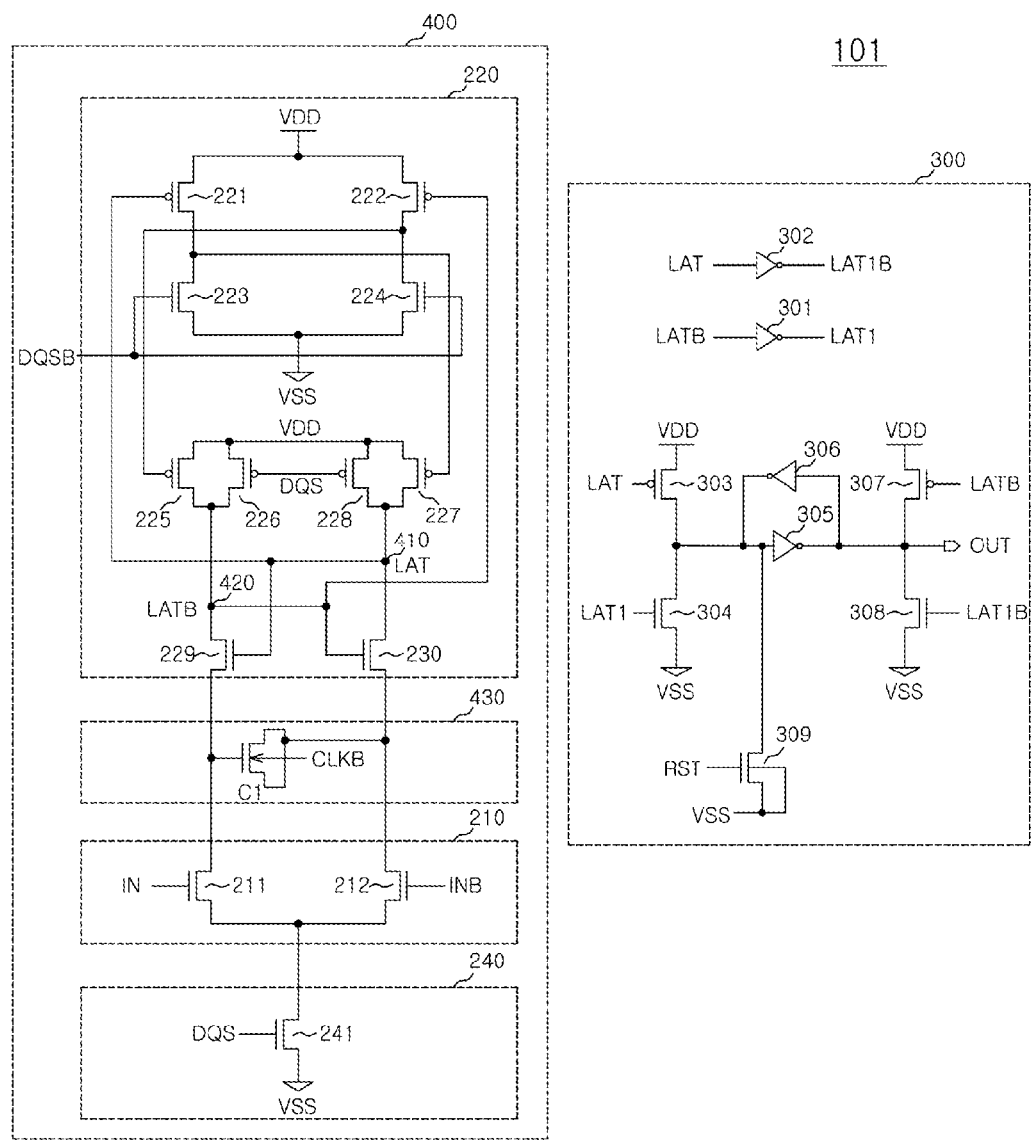
FIG. 2 is a circuit diagram showing a buffer circuit of a semiconductor apparatus in accordance with an embodiment.

As shown in FIG. 2, a buffer circuit 101 of a semiconductor apparatus in accordance with an embodiment may include a sensing circuit 400 and a latch circuit 300.

The sensing circuit 400 may be configured to sense input signals IN and INB in response to data strobe signals DQS and DQSB and generate output signals, that is, latch control signals LAT and LATB, and offset the parasitic components of the output nodes of the latch control signals LAT and LATB in response to a clock signal CLKB.

The data strobe signals DQS and DQSB may be differential signals, the input signals IN and INB may be differential signals, and the latch control signals LAT and LATB may be differential signals.

The sensing circuit 400 may include an input unit 210, a sensing unit 220, an activation unit 240, and a compensation unit 430.

The input unit 210 may be configured to receive the input signals IN and INB.

The input unit 210 may include first and second transistors 211 and 212.

The first transistor 211 has the gate which receives the input signal IN.

The second transistor 212 has the gate which receives the input signal INB and the source which is electrically coupled with the source of the first transistor 211.

The sensing unit 220 may be configured to sense the voltage level difference of the input signals IN and INB during the activation period of the data strobe signals DQS and DQSB, and generate the output signals, that is, the latch control signals LAT and LATB.

The sensing unit 220 may include third to twelfth transistors 221 to 230.

The third transistor 221 has the gate to which the latch control signal LAT is inputted and the source to which a power supply voltage VDD is applied.

The fourth transistor 222 has the gate to which the latch control signal LATB is inputted and the source to which the power supply voltage VDD is applied.

The fifth transistor 223 has the gate to which the data strobe signal DQSB is inputted, the source to which a ground voltage VSS is applied and the drain which is electrically coupled with the drain of the third transistor 221.

The sixth transistor 224 has the gate to which the data strobe signal DQSB is inputted, the source to which the ground voltage VSS is applied and the drain which is electrically coupled with the drain of the fourth transistor 222.

The seventh transistor 225 has the gate which is commonly electrically coupled with the drains of the fourth and sixth transistors 222 and 224 and the source to which the power supply voltage VDD is applied.

The eighth transistor 226 has the gate to which the data strobe signal DQS is inputted, the source to which the power supply voltage VDD is applied and the drain which is electrically coupled with the drain of the seventh transistor 225, and outputs the latch control signal LATB through a node 420 which is electrically coupled with the drain.

The ninth transistor 227 has the gate which is commonly electrically coupled with the drains of the third and fifth transistors 221 and 223 and the source to which the power supply voltage VDD is applied.

The tenth transistor 228 has the gate to which the data strobe signal DQS is inputted, the source to which the power supply voltage VDD is applied and the drain which is electrically coupled with the drain of the ninth transistor 227, and outputs the latch control signal LAT through a node 410 which is electrically coupled with the drain.

The eleventh transistor 229 has the gate which is electrically coupled with the node 410 and receives the latch control signal LAT and the drain which is electrically coupled with the drain of the first transistor 211 of the input unit 210.

The twelfth transistor 230 has the gate which is electrically coupled with the node 420 and receives the latch control signal LATB and the drain which is electrically coupled with the drain of the second transistor 212 of the input unit 210.

The activation unit 240 may be configured to activate the current path of the sensing circuit 400 in response to the data strobe signal DQS.

The activation unit 240 may include a thirteenth transistor 241.

The thirteenth transistor 241 has the gate which receives the data strobe signal DQS, the source which is applied with the ground voltage VSS and the drain which is commonly electrically coupled with the sources of the first and second transistors 211 and 212 of the input unit 210.

The compensation unit 430 may be configured to operate as a capacitor for a predetermined time in response to the clock signal CLKB as a body bias.

The predetermined time may be a period in which the clock signal CLKB toggles repeatedly.

The compensation unit 430 may be configured to serve as a negative impedance component in response to the clock signal CLKB and thereby offset the parasitic components of the nodes 410 and 420 of the latch control signals LAT and LATB.

The clock signal CLKB may toggle to a phase opposite to a clock signal CLK in an activation mode (for example, a read or write mode) of the semiconductor apparatus, and may be retained at logic high in a deactivation mode (for example, a standby or power-down mode) of the semiconductor apparatus.

The compensation unit 430 may be constituted by a capacitor C1 which uses a MOS transistor.

The capacitor C1 has the gate which is electrically coupled with the node 420 (i.e., first node) of the latch control signal LATB (i.e., first latch control signal or first differential latch control signal) through the eleventh transistor 229, and the source and the drain which are electrically coupled with the node 410 (i.e., second node) of the latch control signal LAT (i.e., second latch control signal or second differential latch control signal) through the twelfth transistor 230.

The clock signal CLKB is applied as the body bias of the capacitor C1.

The latch circuit 300 may be configured to generate and latch output data OUT in response to the output signals of the sensing circuit 200, that is, the latch control signals LAT and LATB.

The latch circuit 300 may include first to fifth transistors 303, 304 and 307 to 309 and first to fourth inverters 301, 302, 305 and 306.

The first inverter 301 inverts and delays the latch control signal LATB and outputs a delayed latch control signal LAT1.

The second inverter 302 inverts and delays the latch control signal LAT and outputs a delayed latch control signal LAT1B.

The first transistor 303 has the gate which receives the latch control signal LAT and the source which is applied with the power supply voltage VDD.

The second transistor 304 has the gate which receives the delayed latch control signal LAT1, the source which is applied with the ground voltage VSS and the drain which is electrically coupled with the drain of the first transistor 303.

The third transistor 307 has the gate which receives the latch control signal LATB and the source which is applied with the power supply voltage VDD.

The fourth transistor 308 has the gate which receives the delayed latch control signal LAT1B, the source which is applied with the ground voltage VSS and the drain which is electrically coupled with the drain of the third transistor 307.

The output data OUT is generated from a node to which the drain of the third transistor 307 and the drain of the fourth transistor 308 are electrically coupled.

The third inverter 305 has the input terminal which is commonly electrically coupled with the drains of the first and second transistors 303 and 304 and the output terminal which is commonly electrically coupled with the drains of the third and fourth transistors 307 and 308.

The fourth inverter 306 feeds back the output of the third inverter 305 to the input terminal of the third inverter 305.

The fifth transistor 309 has the gate which receives a reset signal RST, the source and the bulk terminal to which the ground voltage VSS is commonly applied and the drain which is electrically coupled with the input terminal of the third inverter 305.

Hereinbelow, an operation principle in which the compensation unit 430 serves as a negative impedance component will be described with reference to FIGS. 3 and 4.

Figure 3:
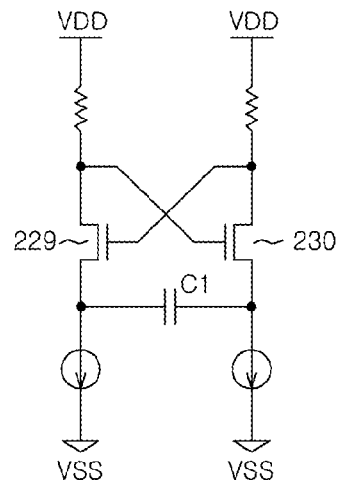
FIGS. 3 and 4 are equivalent circuit diagrams of the buffer circuit of a semiconductor apparatus in accordance with an embodiment.

As shown in FIG. 3, the sensing circuit 400 may be represented as an equivalent circuit on the basis of the eleventh transistor 229, the twelfth transistor 230 and the capacitor C1 of the compensation unit 430.

Figure 4:
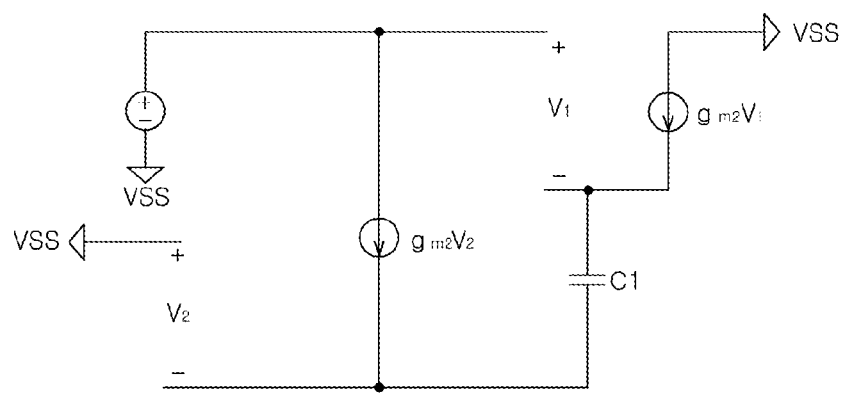

Further, the equivalent circuit of FIG. 3 may be represented as an equivalent circuit of a small current model, as shown in FIG. 4.

In FIG. 4, current Ix flowing through the capacitor C1 may be defined as follows.

$$Ix=(gm2+sC1)V2 \text{ and } Ix=(gm1+sC1)V1, \text{ wherein gm is trans-conductance and C is capacitance.}$$

Further, a voltage Vx flowing through the capacitor C1 may be defined as follows.

$$Vx=V1-V2$$

Accordingly, the impedance component of the capacitor C1 may be defined as follows.

$$Vx/Ix=-2/(gm+C1s)$$

That is to say, the impedance component of the capacitor C1 has a negative impedance characteristic.

Operations of the buffer circuit 101 in accordance with an embodiment, configured as mentioned above, will be described below.

The activation unit 240 activates the current path of the sensing circuit 200 during the activation period of the data strobe signal DQS, that is, during a period in which the data strobe signal DQS is logic high and the data strobe signal DQSB is logic low.

The sensing unit 220 senses the voltage level difference of the input signals IN and INB inputted through the input unit 210, that is, differential signals, by interoperations of the third, fourth, seventh, ninth, tenth and eleventh transistors 221, 222, 225, 227, 229 an 230, and generates the latch control signals LAT and LATB.

The clock signal CLKB toggles during the activation period of the data strobe signal DQS.

As the clock signal CLKB toggles, the capacitor C1 of the compensation unit 430 serves as a negative impedance component and offsets the parasitic components of the nodes 410 and 420 of the latch control signals LAT and LATB.

Therefore, the charge/discharge of the latch control signals LAT and LATB may be quickly implemented.

The latch circuit 300 generates and latches the output data OUT of a level corresponding to the input signals IN and INB in response to the latch control signals LAT and LATB and the delayed latch control signals LAT1 and LAT1B.

The output terminal of the latch circuit 300 may be initialized to logic high by the reset signal RST.

Since the charge/discharge of the latch control signals LAT and LATB may be quickly implemented due to the presence of the compensation unit 430, the high speed operation of the buffer circuit 101 becomes possible.

Meanwhile, if the data strobe signal DQS is deactivated, that is, the data strobe signal DQS becomes logic low and the data strobe signal DQSB becomes logic high, the fifth to tenth transistors 223 to 228 perform an operation of initializing the sensing circuit 200, that is, an operation of precharging the latch control signals LAT and LATB to logic high.

The clock signal CLKB retains logic high during the deactivation period of the data strobe signal DQS.

As the clock signal CLKB serving as the body bias of the capacitor C1 retains logic high, the gate-source voltage (Vgs) of the capacitor C1 is raised.

As the gate-source voltage (Vgs) is raised, the capacitor C1 is deactivated, that is, does not serve as a negative impedance component, and at the same time, current consumption is reduced, whereby the low power operation of the buffer circuit 101 becomes possible.

As is apparent from the above descriptions, according to the embodiments, the buffer circuit of a semiconductor apparatus is appropriate for a low power consumption and high speed operation, and stable data strobing is possible.

Figure 5:
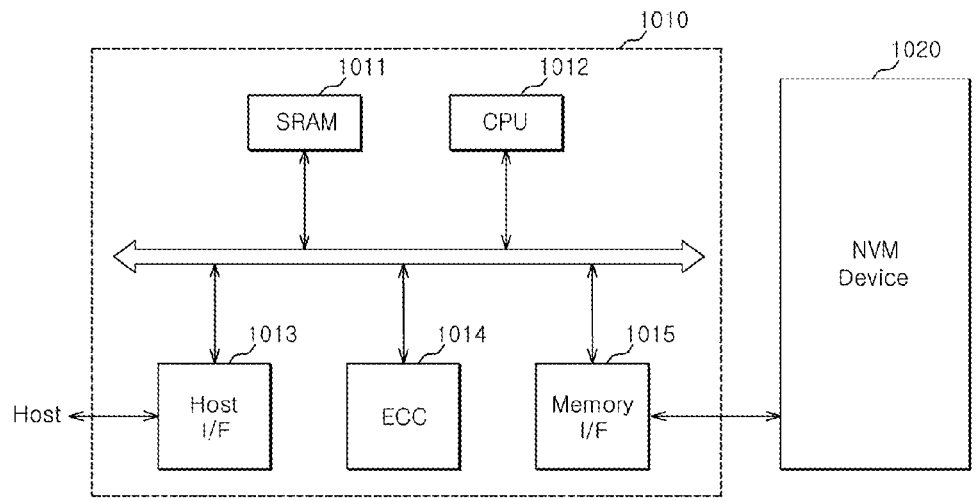
FIG. 5 is a schematic block diagram of a memory system according to an embodiment.

Referring to FIG. 5, a memory system 1000 according to an embodiment may include a non-volatile memory device 1020 and a memory controller 1010.

The non-volatile memory device 1020 may be configured to include the above-described semiconductor apparatus and buffer circuit. The memory controller 1010 may be configured to control the non-volatile memory device 1020 in a general operation mode such as a program loop, a read operation or an erase loop.

The memory system 1000 may be a solid state disk (SSD) or a memory card in which the memory device 1020 and the memory controller 1010 are combined. SRAM 1011 may function as an operation memory of a processing unit (CPU) 1012. A host interface 1013 may include a data exchange protocol of a host being coupled to the memory system 1100. An error correction code (ECC) block 1014 may detect and correct errors included in a data read from the non-volatile memory device 1020. A memory interface (I/F) 1015 may interface with the non-volatile memory device 1120. The CPU 1012 may perform the general control operation for data exchange of the memory controller 1110.

Though not illustrated in FIG. 5, the memory system 1100 may further include ROM that stores code data to interface with the host. In addition, the non-volatile memory device 1020 may be a multi-chip package composed of a plurality of flash memory chips. The memory system 1000 may be provided as a storage medium with a low error rate and high reliability. A memory system 1000 such as a Solid State Disk (SSD), on which research has been actively carried out, may include a flash memory device according to an embodiment of the present invention. In this case, the memory controller 1010 may be configured to communicate with the outside (e.g., a host) through one of the interface protocols including USB, MMC, PCI-E, SATA, PATA, SCSI, ESDI and IDE.

Figure 6:
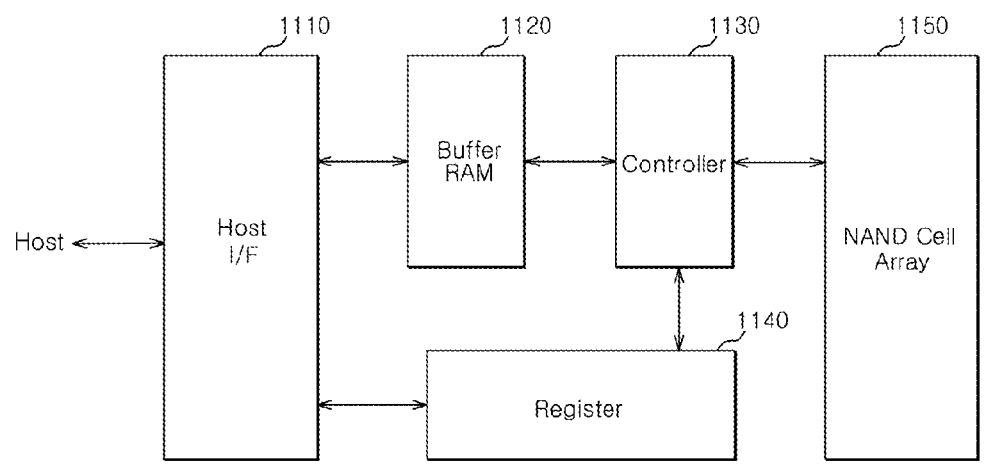
FIG. 6 is a schematic block diagram of a fusion memory device or a fusion memory system configured to include the buffer circuit according to an embodiment.

Referring to FIG. 6, a OneNAND flash memory device 1100 may include a host interface (I/F) 1110, a buffer RAM 1120, a controller 1130, a register 1140 and a NAND flash cell array 1150. The OneNAND flash memory device 1100 may be used in a fusion memory device.

The host interface 1110 may be configured to exchange various types of information with a device through a different protocol. The buffer RAM 1120 may have built-in codes for driving the memory device or temporarily store data. The controller 1130 may be configured to control read and program operations and every state in response to a control signal and a command that are externally provided. The register 1140 may be configured to store data including instructions, addresses and configurations defining a system operating environment in the memory device. The NAND flash cell array 1150 may be formed of operation circuits including non-volatile memory cells and page buffers. The NAND cell array 1150 may include the embodiments as described above with reference to FIGS. 1-4 above.

Figure 7:
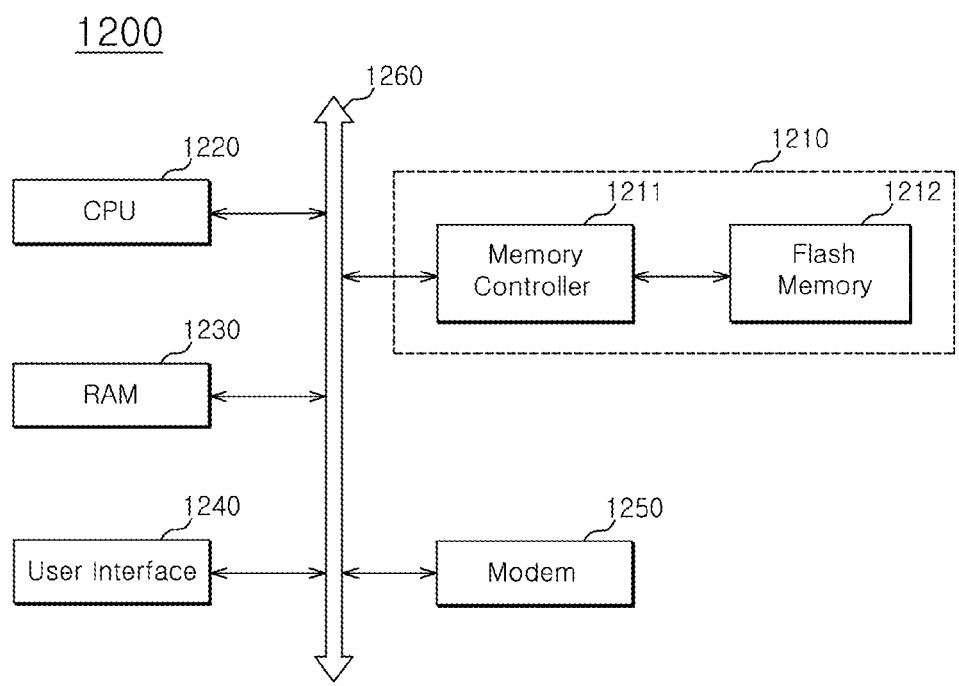
FIG. 7 is a schematic block diagram of a computing system including a flash memory device according to an embodiment.

Referring to FIG. 7, a computing system 1200 may include a microprocessor (CPU) 1220, RAM 1230, a user interface 1240, a modem 1250, such as a baseband chipset, and a memory system 1211 that are electrically coupled to a system bus 1260. The memory system may include the embodiments described above with reference to FIGS. 1-5 above. In addition, if the computing system 1300 is a mobile device, then a battery (not illustrated) may be additionally provided to apply an operating voltage to the computing system 1200. Though not illustrated in FIG. 7, the computing system 1200 may further include application chipsets, a Camera Image Processor (CIS), or mobile DRAM. The memory system 1210 may include a flash memory device 1212 according to the above embodiments. That is, the memory system 1210 may form a Solid State Drive/Disk (SSD) that uses a non-volatile memory to store data. The memory system 1310 may be provided as a fusion flash memory (e.g., OneNAND flash memory).

While certain embodiments have been described above, it will be understood to those skilled in the art that the embodiments described are by way of example only. Accordingly, the buffer circuit of a semiconductor apparatus described herein should not be limited based on the described embodiments. Rather, the buffer circuit of a semiconductor apparatus described herein should only be limited in light of the claims that follow when taken in conjunction with the above description and accompanying drawings.

What is claimed is:

1. A buffer circuit of a semiconductor apparatus, comprising:
   a sensing unit configured to sense a voltage level difference of differential input signals and generate latch control signals, during an activation period of a data strobe signal;
   an activation unit configured to activate a current path of the sensing unit in response to the data strobe signal;
   a compensation unit configured to serve as a negative impedance component in response to a clock signal and remove parasitic components of nodes; and
   a latch circuit configured to generate and latch output data in response to the latch control signals.

2. The buffer circuit according to claim 1, wherein the compensation unit comprises:
   a capacitor configured to be applied with the clock signal as a body bias.

3. A buffer circuit of a semiconductor apparatus, comprising:
   a sensing unit configured to electrically couple with a power supply terminal, sense a voltage level difference of differential input signals during an activation period of a data strobe signal, generate latch control signals, and provide the latch control signals at nodes;
   an activation unit configured to electrically couple with a ground terminal, and activate a current path of the sensing unit in response to the data strobe signal;
   an input unit configured to electrically couple with the activation unit, and receive the differential input signals; and
   a compensation unit electrically coupled with the sensing unit and the input unit, and configured to remove parasitic components of the nodes in response to a clock signal.

4. The buffer circuit according to claim 3, wherein the compensation unit is configured to serve as a negative impedance component in response to the clock signal and remove the parasitic components of the nodes.

5. The buffer circuit according to claim 3, wherein the compensation unit is configured to operate as a capacitor for a predetermined time in response to the clock signal as a body bias.

6. A buffer circuit of a semiconductor apparatus, comprising:
   a sensing unit configured to sense a voltage level difference of differential input signals during an activation period of a data strobe signal, generate and provide a first differential latch control signal at a first node, and generate and provide a second differential latch control signal at a second node;
   an activation unit configured to activate a current path of the sensing unit in response to the data strobe signal; and
   a capacitor electrically coupled with the first node and the second node, and configured to remove parasitic components of the first and second nodes in response to a clock signal.

7. The buffer circuit according to claim 6, wherein the capacitor comprises a transistor having a gate which is electrically coupled with the first node and a source and a drain which are electrically coupled with the second node, and applied with the clock signal as a body bias.

* * * * *